US011077535B2

(12) United States Patent
Lopez et al.

(10) Patent No.: US 11,077,535 B2
(45) Date of Patent: Aug. 3, 2021

(54) PROCESS SYSTEM HAVING LOCKING PIN AND LOCKING PIN (71) Applicant: Samsung Electronics Co., Ltd., Suwon-si (KR)

(72) Inventors: Hector Lopez, Round Rock, TX (US); Juan Moncada, Austin, TX (US)

(73) Assignee: SAMSUNG ELECTRONICS CO., LTD.

(*) Notice: Subject to any disclaimer, the term of this patent is extended or adjusted under 35 U.S.C. 154(b) by 664 days.

(21) Appl. No.: 15/897,133

(22) Filed: Feb. 14, 2018

(65) Prior Publication Data
US 2019/0247977 A1 Aug. 15, 2019

(51) Int. Cl.
B24B 37/34 (2012.01)
B24B 55/00 (2006.01)
H01L 21/67 (2006.01)
F16P 3/00 (2006.01)
H01L 21/02 (2006.01)
(Continued)

(52) U.S. Cl.
CPC .............. B24B 55/00 (2013.01); B24B 37/34 (2013.01); F16P 3/008 (2013.01); H01L 21/02002 (2013.01); H01L 21/67 (2013.01); H01L 21/67742 (2013.01); H01L 21/67745 (2013.01);
(Continued)

(58) Field of Classification Search
CPC ... H01L 21/02; H01L 21/67; H01L 21/67742; H01L 21/67745; H01L 21/67766; H01L 21/68707; B24B 55/00; B24B 37/34; B25J 9/042; B25J 18/00; Y10S 901/27

USPC .............. 451/332, 339, 442; 192/139, 114 T, 192/114 R
See application file for complete search history.

(56) References Cited

U.S. PATENT DOCUMENTS 7,955,162 B2 6/2011 Boeck et al.
10,179,941 B1 * 1/2019 Khan ................ H01L 21/67017
(Continued)

FOREIGN PATENT DOCUMENTS

CN 203374075 U 1/2014
DE 102008028086 A1 12/2009

OTHER PUBLICATIONS

Activecycles (ebay), "Avid / Sram Disc Brake Transport Lock Pad Spacer for Elixir 7 / X0 Trail / Guide", http://www.ebay.co.uk/itm/Avid-Sram-Disc-Brake-Transport-Lock-Pad-Spacer-for-Elixir-7-X0-Trail-Guide-/352190280025, Accessed Nov. 7, 2017.
(Continued)

Primary Examiner — Eileen P Morgan
(74) Attorney, Agent, or Firm — Renaissance IP Law Group LLP (57) ABSTRACT A process system of performing a fabrication process on a wafer includes a wafer storage cassette, one or more process chambers, a transfer chamber having a body and a lid that detachably covers the body, and a locking pin. The transfer chamber also includes a robot hub, a robot arm attached to the robot hub, and a blade attached to the robot arm. The body of the transfer chamber is connected to the wafer storage cassette and the process chambers, and the robot arm is configured to transfer a wafer from the wafer storage cassette through the body of the transfer chamber to one or more of the process chambers. The locking pin is configured to detachably attach to the robot arm to constrain the blade at a predetermined position within the transfer chamber.

9 Claims, 6 Drawing Sheets (51) Int. Cl.
　　　*H01L 21/677* (2006.01)
　　　*H01L 21/687* (2006.01)
(52) U.S. Cl.
　　　CPC .. *H01L 21/67766* (2013.01); *H01L 21/68707* (2013.01)

(56) References Cited

U.S. PATENT DOCUMENTS

| | | | | |
|---|---|---|---|---|
| 2004/0005211 | A1* | 1/2004 | Lowrance | H01L 21/68707 414/744.1 |
| 2007/0107598 | A1* | 5/2007 | Lee | H01L 21/67781 96/74 |
| 2010/0180913 | A1* | 7/2010 | Arena | C23C 16/4405 134/2 |
| 2012/0027542 | A1* | 2/2012 | Isomura | H01L 21/67742 414/217 |
| 2013/0129462 | A1* | 5/2013 | Minami | H01L 21/67742 414/751.1 |
| 2013/0180953 | A1* | 7/2013 | Iwai | H01L 21/6732 216/60 |
| 2013/0183121 | A1* | 7/2013 | Isomura | H01L 21/67745 414/217 |
| 2016/0126128 | A1* | 5/2016 | Bonora | H01L 21/6715 414/222.02 |
| 2017/0352540 | A1* | 12/2017 | Watanabe | C23C 14/566 |
| 2018/0258533 | A1* | 9/2018 | Liang | H01L 21/68742 |
| 2018/0271604 | A1* | 9/2018 | Grout | F16B 21/165 |
| 2019/0159919 | A1* | 5/2019 | Turconi | A61F 5/0102 |
| 2019/0291281 | A1* | 9/2019 | Bellandi | B25J 15/0408 |
| 2020/0388523 | A1* | 12/2020 | Bonora | H01L 21/67178 |

OTHER PUBLICATIONS

Sold by Trail This and Fulfilled by Amazon, "Avid Pad Spreader Tool—Elixir", https://www.amazon.com/Avid-Pad-Spreader-Tool-Elixir/dp/B004QCJXJM, Accessed Nov. 7, 2017.
solowsports.com, "Badminton Throat Load Spreader String Tool", http://www.solowsports.com/badminton-throat-load-spreader-string-tool-6737.html, Accessed Nov. 7, 2017.

* cited by examiner

PROCESS SYSTEM HAVING LOCKING PIN AND LOCKING PIN

TECHNICAL FIELD

The present inventive concept relates to a process system having a locking pin, a locking pin and a method of cleaning process system using a locking pin.

DISCUSSION OF RELATED ART

Multi-chamber process systems are widely used in a fabrication of semiconductor devices. With multi-chamber process systems, various processes are performed in the multi-chamber process systems. Multi-chamber process systems include a transfer chamber to facilitate a distribution of a wafer among at least two or more process chambers. To conduct maintenance of the multi-chamber process systems, a lid of the transfer chamber is lifted and the interior of the transfer chamber is cleaned. Robot mechanism in the transfer chamber, for example, makes the cleaning difficult because free movements of the robot mechanism may cause blades of the robot mechanism to collide with the interior of the transfer chamber, which leads to damage of the blades. To avoid such damage, maintenance engineers need careful manipulation of the robot mechanism. This may increase maintenance time.

SUMMARY

According to an exemplary embodiment of the present inventive concept, a process system of performing a fabrication process on a wafer includes a wafer storage cassette, one or more process chambers, a transfer chamber having a body and a lid that detachably covers the body, and a locking pin. The transfer chamber also includes a robot hub, a robot arm attached to the robot hub, and a blade attached to the robot arm. The body of the transfer chamber is connected to the wafer storage cassette and the process chambers, and the robot arm is configured to transfer a wafer from the wafer storage cassette through the body of the transfer chamber to one or more of the process chambers. The locking pin is configured to detachably attach to the robot arm to constrain the blade at a predetermined position within the transfer chamber.

According to an exemplary embodiment of the present inventive concept, a locking pin includes a handle and a plurality of fingers extended from the handle. The handle and the plurality of fingers may be formed of Teflon.

BRIEF DESCRIPTION OF DRAWINGS

These and other features of the present inventive concept will become more apparent by describing in detail exemplary embodiments thereof with reference to the accompanying drawings of which.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF EXEMPLARY EMBODIMENTS

Figure 1:
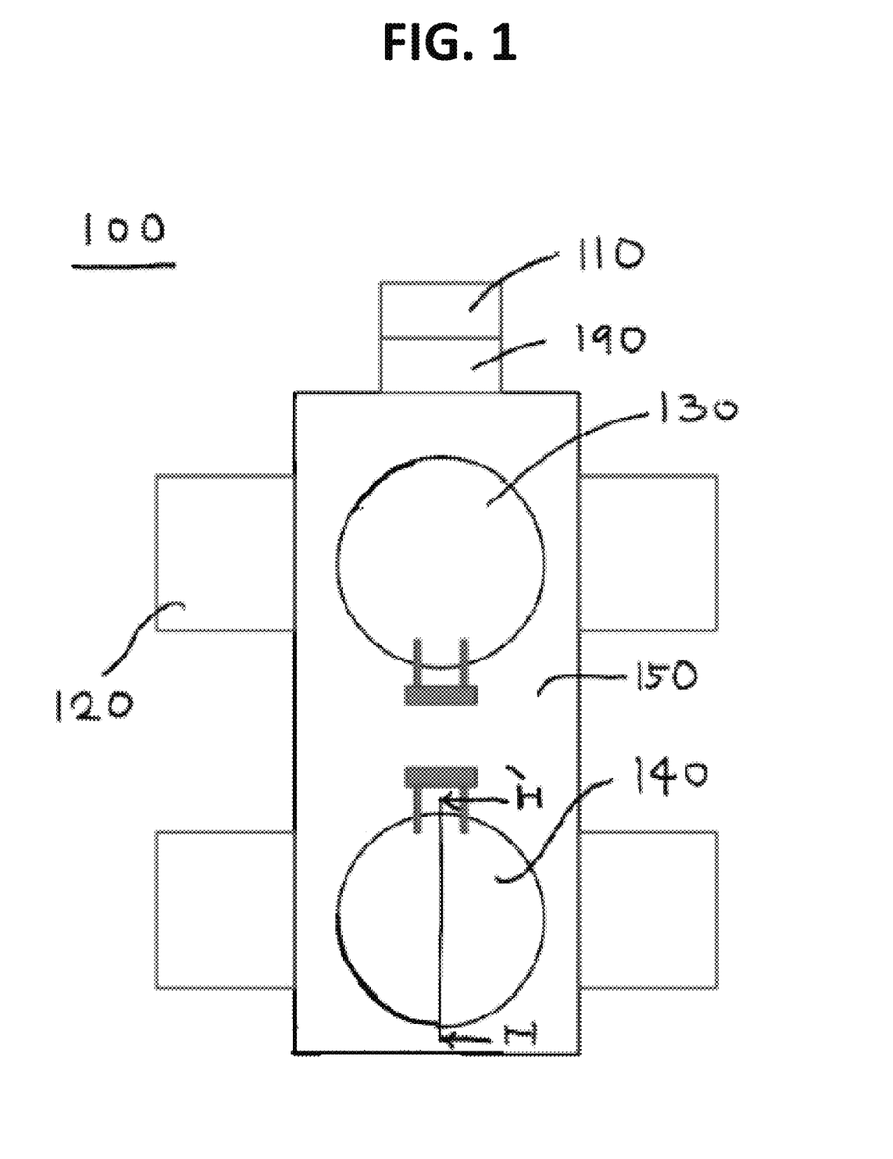
FIG. 1 shows a process system of performing a fabrication process on a wafer according to an exemplary embodiment of the present inventive concept.
Figure 2:
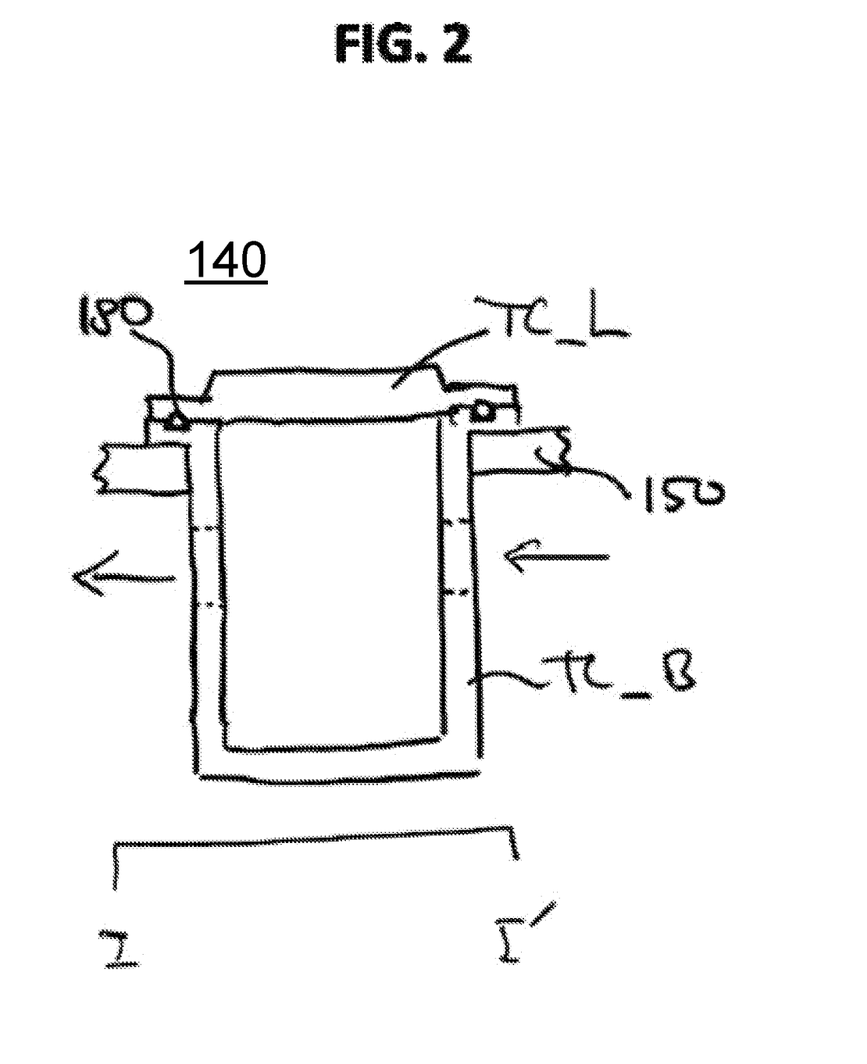
FIG. 2 shows a cross-sectional view taken along line I-I' of FIG. 1 according to an exemplary embodiment of the present inventive concept.

FIG. 1 shows a process system 100 of performing a fabrication process on a wafer according to an exemplary embodiment of the present inventive concept. FIG. 2 shows a cross-sectional view taken along line I-I' of FIG. 1 according to an exemplary embodiment of the present inventive concept.

In FIGS. 1 and 2, the process system 100 includes a wafer storage cassette 110, a plurality of process chambers 120, a front transfer chamber 130, a rear transfer chamber 140, and a frame 150.

The wafer storage cassette 110 may be provided in plural. For example, the process system 100 may include two wafer storage cassettes. The wafer storage cassette 110 receives a wafer to be processed in at least one of the process chambers 120 and distributes the wafer to one of the process chambers 120 through the front transfer chamber 130 or the rear transfer chamber 140 according to a process sequence. The process sequence may be controlled using a controller (not shown here).

The front transfer chamber 130 may include a robot mechanism (not shown here) to transfer a wafer from the wafer storage cassette 110 to one of the process chambers 120. The robot mechanism of the front transfer chamber 130 may also transfer a wafer from one of the process chambers 120 to another process chamber of the process chambers 120. The robot mechanism of the front transfer chamber 130 may be controlled by the controller.

The rear transfer chamber 140 may include a robot mechanism (not shown here) to transfer a wafer received from the front transfer chamber 130 to one of the process chambers 120. The robot mechanism of the rear transfer chamber 140 may also transfer a wafer from one of the process chambers 120 to another one of the process chambers 120. The front transfer chamber 130 is substantially the same in structure and operation with the rear transfer chamber 140, except for their locations in the process system 100. For example, the front transfer chamber 130 and the rear transfer chamber 140 may include the same robot mechanism.

The process system 100 further includes a load lock 190 disposed between the wafer storage cassette 110 and the front transfer chamber 130. The load lock 190 minimizes the break of the vacuum state of the front transfer chamber 130 when transferring a wafer from the wafer storage cassette 110 to one of the process chambers 120.

Each of the front transfer chamber 130 and the rear transfer chamber 140 includes a body TC_B and a lid TC_L. For the convenience of a description, the front transfer chamber 130 will be described with reference to FIG. 2. The body TC_B has a space to accommodate movements of a robot mechanism (not shown here) to transfer a wafer from the front transfer chamber 130 to one of the process chambers 120 or the rear transfer chamber 140. The space of the body TC_B may be in a vacuum state while the process system 100 operates. The lid TC_L covers the body TC_B to maintain the vacuum state while the process system 100 operates. An O-ring 180 is inserted between the lid TC_L and the body TC_B to seal an air leak passage therebetween when the space of the body TC_B is pumped to maintain the vacuum state.

The frame 150 holds the front transfer chamber 130 and the rear transfer chamber 140. In an exemplary embodiment, the process chambers 120 may be attached to the frame 150. The frame 150 may serve as a structural support of the process system 100.

The process system 100 further includes a load lock 190 disposed between the wafer storage cassette 110 and the front transfer chamber 130. With the load lock 190, the process system 100 may minimize the break of the vacuum state of the front transfer chamber 130 when transferring a wafer from the wafer storage cassette 110 to one of the process chambers 120.

To clean the interior of the body TC_B of the front transfer chamber 130 for maintenance of the process system 100, the lid TC_L is lifted and the interior of the body TC_B is exposed. The lid TC_L detachably covers the body TC_B to maintain the vacuum state while the process system 100 operates, and is lifted for maintenance.

Figure 3:
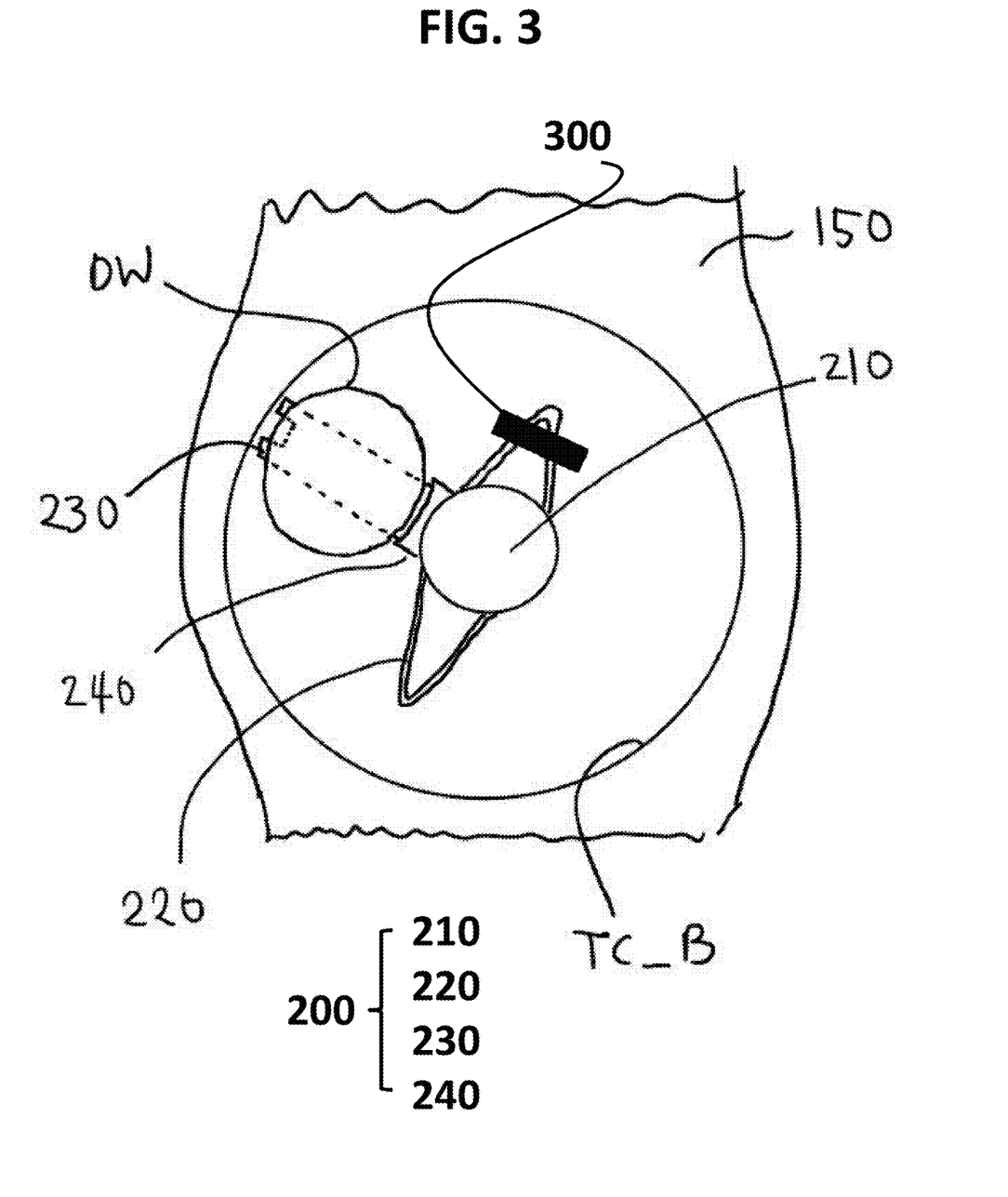
FIG. 3 shows a top view of a robot mechanism of a process system locked with a locking pin according to an exemplary embodiment of the present inventive concept.

FIG. 3 shows a top view of a robot mechanism of a process system locked with a locking pin according to an exemplary embodiment of the present inventive concept.

For the convenience of description, a robot mechanism 200 of the front transfer chamber 130 will be described. When the process system 100 is in operation, the robot mechanism 200 serves to transfer a wafer among the process chambers 120 through the front transfer chamber 130. During maintenance of the process system 100, the robot mechanism 200 is deactivated, and movements of the robot mechanism 200 may not be under control. In this case, a part of the robot mechanism 200 may collide with the body TC_B.

In FIG. 3, the robot mechanism 200 includes a robot hub 210, a robot arm 220 and a blade 230. The robot arm 220 is attached to the robot hub 210 and the blade 230. For example, the robot arm 220 is disposed between the robot hub 210 and the blade 230. The robot mechanism 200 also includes a lateral shoulder 240 that connects the blade 230 to the robot arm 220. When the process system 100 is in operation, the robot hub 210 controls movements of the robot arm 220. For example, the robot arm 220 may be extended or contracted to transfer a wafer placed on the blade 230. When the process system 100 is in maintenance, the robot hub 210 is de-activated, and thus the robot arm 220 may be free to move when an external force is applied to the robot arm 220. For example, maintenance engineers may apply a force to the robot arm 220 and cause the blade 230 may be moved around while cleaning the interior of the body TC_B of the front transfer chamber 130. In this case, since the robot arm 220 may be free to move, the blade 230 may hit a metal housing of the body TC_B, thereby causing damage to itself and/or the housing. If this occurs, the blade 230 may need to be replaced. The blade 230 may be formed of a ceramic material including silicon carbide (SiC).

A lock pin 300 is attached to the robot arm 220. In this case, the robot arm 220 locked with the lock pin 300 is positioned at a predetermined position so that when the blade 230 is moved around for maintenance, the blade 230 is positioned away from the metal housing of the body TC_B to avoid collision. In other words, the lock pin 300 locks the blade 230 in place and keeps it from extending into any position that may cause damage. A dummy wafer or calibration wafer DW is positioned on the blade 230 so that the locking pin 300 is confirmed to be properly installed. For example, the blade 230 may be in a position that creates a ¼ inch gap from the robot hub 210.

For the convenience of description, the robot mechanism 200 has a single blade, but the present inventive concept is not limited thereto. For example, the robot mechanism 200 may include two blades. In this case, when the lock pin 300 is installed, both blades may be allowed to rotate 180 degrees at the same time.

Figure 4:
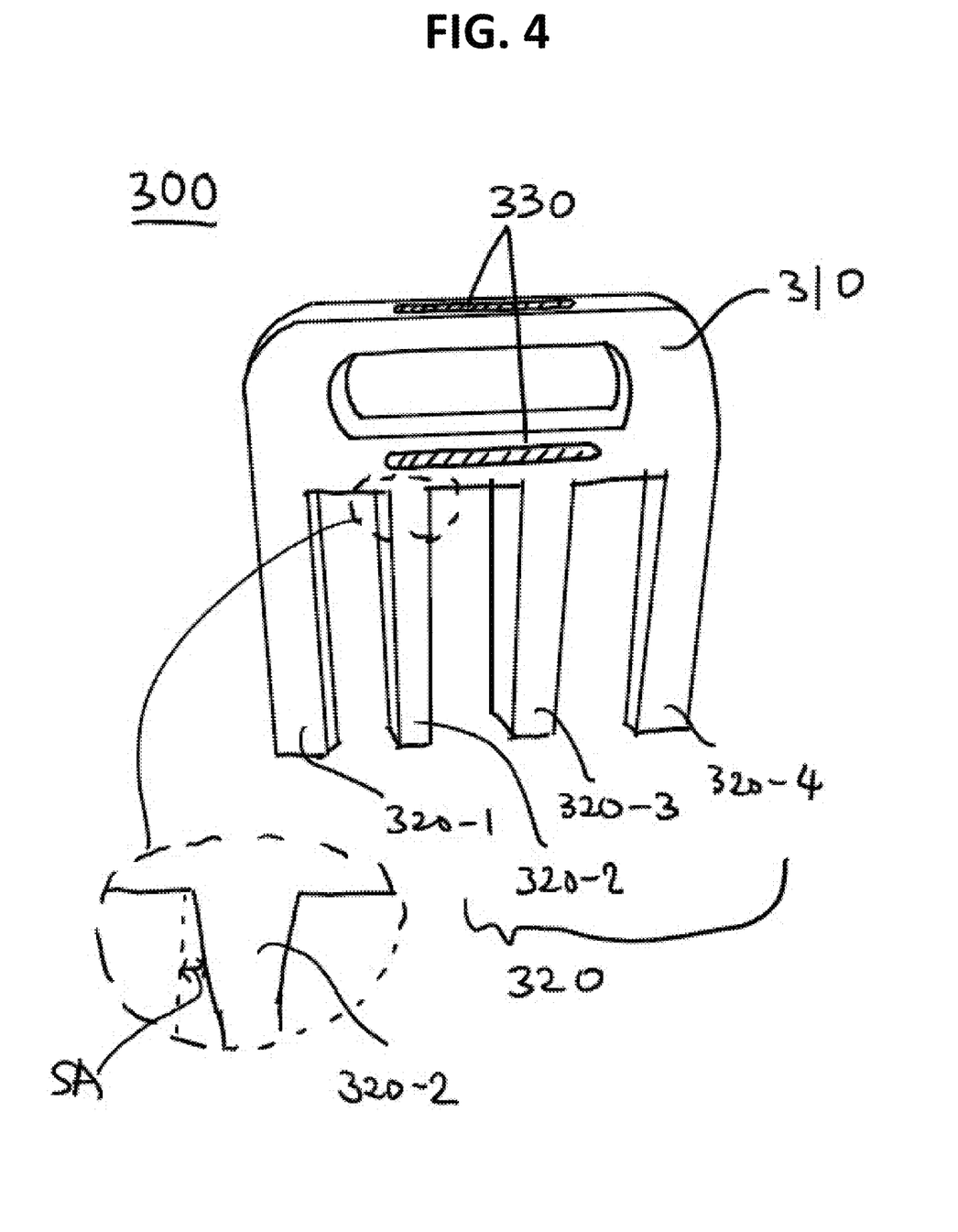
FIG. 4 is a perspective view of a locking pin according to an exemplary embodiment of the present inventive concept.

FIG. 4 is a perspective view of a locking pin according to an exemplary embodiment of the present inventive concept.

The locking pin 300 includes a handle 310 and a plurality of fingers 320 extended from the handle 310. The locking pin 300 may be formed of Teflon. For example, the handle 310 and the fingers 320 may be formed of Teflon.

The locking pin 300 may be formed from a 6'×6.5' block of Teflon. The block may be milled to the locking pin 300 having the handle 310 and the fingers 320. For the convenience of description, the fingers 320 are formed of four fingers, but the present inventive concept is not limited thereto. The handle 310 may allow maintenance engineers to install the locking pin 300 in place and rotate the robot arm 220.

Each of the fingers 320 may have a predetermined sidewall angle SA to keep the blade 230 locked into a position in which the blade 230 is prevented from colliding with the metal housing of the body TC_B. The predetermined sidewall angle SA optimizes the function of the locking pin 300. The predetermined angle SA may be derived from the following requirements. First, the predetermined sidewall angle SA provides the right distance to safely rotate the blade 230 around the front transfer chamber 130, for example. Second, the predetermined sidewall angle SA also gives the blade 230 enough gap between the blade 230 and the robot hub 210. Since the back of blade 230 is in a metal housing, as is the robot hub 210, the gap will eliminate particles during rotation of the blade 230.

For example, each of the fingers 320 may have the sidewall angle SA of about 27 degree angles.

The locking pin 300 also includes two red tabs 330 that help maintenance engineers position the locking pin 300 in the proper direction and serve as a visual reminder to remove the locking pin 300 once maintenance is done.

In an exemplary embodiment, at least two fingers of fingers 320 have different thickness from each other. The fingers 320 may have different thicknesses so that the locking pin 300 properly constrains the robot arm 220 at a predetermined position. For example, two fingers 320-2 and 320-3 are different in thickness. For example, two fingers 320-1 and 320-2 are different in thickness.

Figure 5:
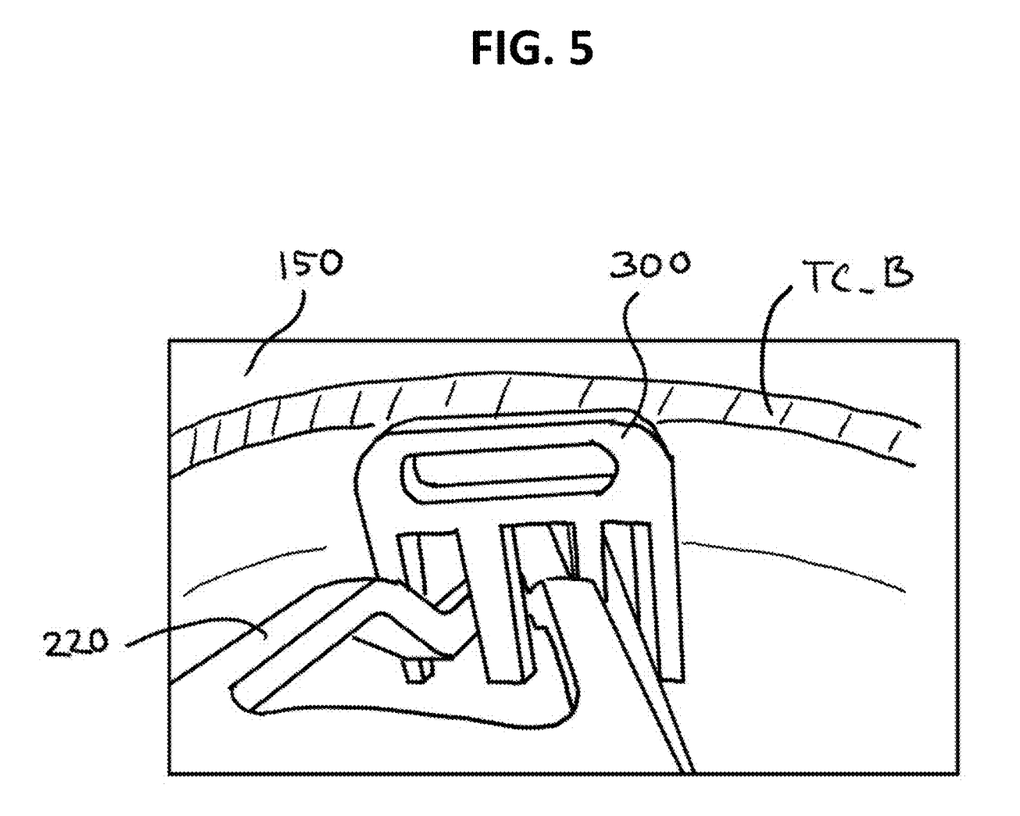
FIG. 5 shows a perspective view of a locking pin installed on a robotic arm of a process system according to an exemplary embodiment of the present inventive concept.

FIG. 5 shows a perspective view of a locking pin installed on a robotic arm of a process system according to an exemplary embodiment of the present inventive concept.

When the locking pin 300 is installed on the robot arm 220, the robot arm 220 and the fingers 320 are interleaved so that the robot arm 220 is not allowed to be extended or contracted. The fingers 320 may have a predetermined slope so that the fingers 320 lock the robot arm 220 to a predetermined position in which the blade 230 is prevented from colliding with the metal housing while the front transfer chamber 130 is cleaned for maintenance.

Figure 6:
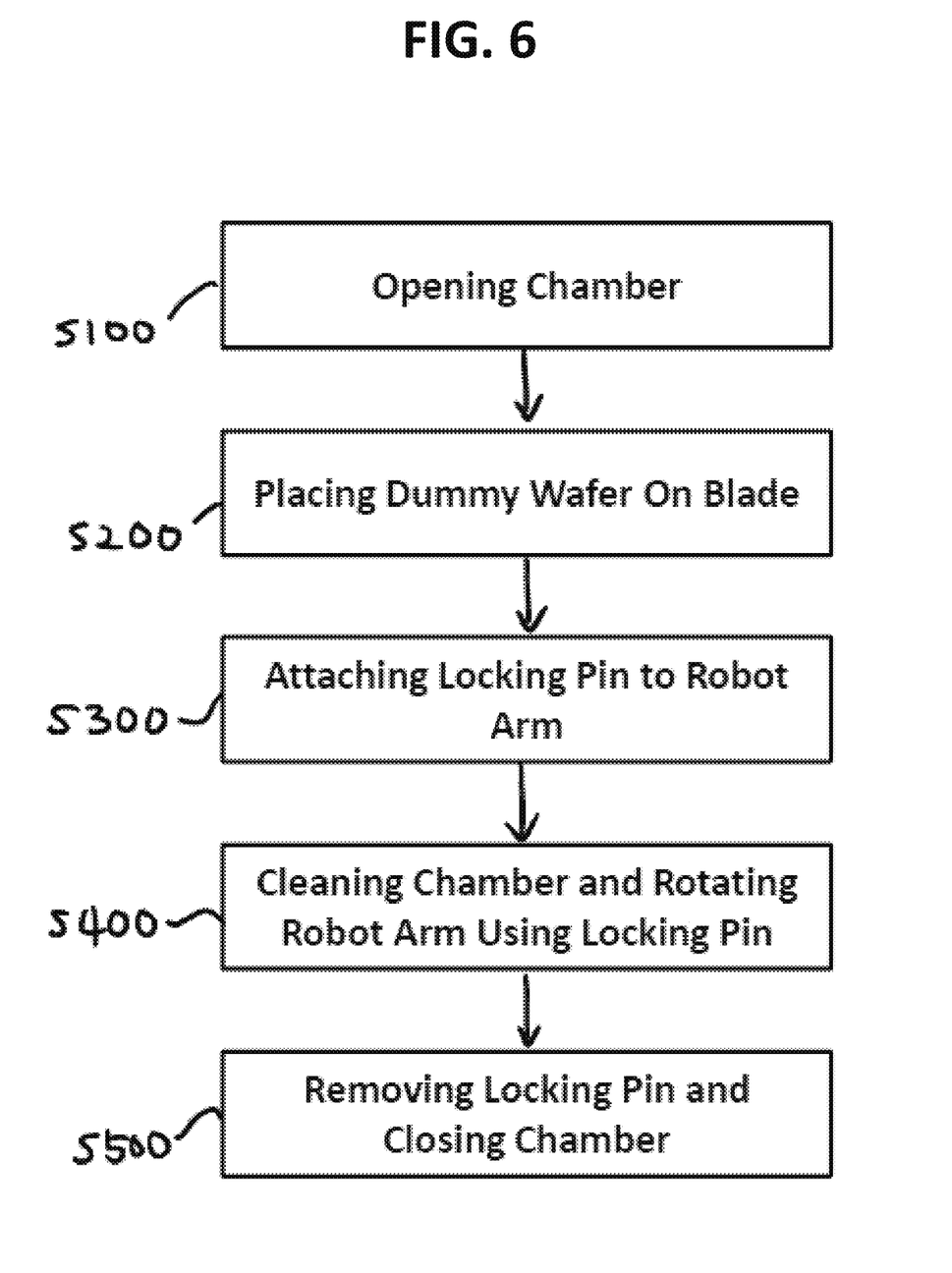
FIG. 6 shows a flow chart of cleaning a process system according to an exemplary embodiment of the present inventive concept.

FIG. 6 shows a flow chart of cleaning a process system according to an exemplary embodiment of the present inventive concept. The cleaning of the process system 100 will be described with reference to FIGS. 1-3 as well as FIG. 6.

In step S100, the front transfer chamber 130 is opened for maintenance including cleaning the interior of the front transfer chamber 130. The robot mechanism 200 is exposed as shown in FIG. 3.

In step S200, a dummy wafer DW is placed on the blade 230. The dummy wafer DW may be visually checked to confirm that the locking pin 300 is properly installed on the robot arm 220, which will be described below.

In step S300, the locking pin 300 is installed on the robot arm 220 so that the blade 230 is positioned at a predetermined position in which the blade 230 is prevented from colliding with the metal housing of the body TC_B.

In step S400, the robot arm 220 is rotated using the locking pin 300. Maintenance engineers may apply a force to the robot arm 220 through the locking pin 300. In this case, the robot arm 220 is locked with the locking pin 300, and the blade 230 does not collide with the metal housing of the body TC_B. In this step, the maintenance engineers may clean the interior of the front transfer chamber 130 while rotating the robot arm 220 through the locking pin 300. For example, the bottom of the front transfer chamber 130 may be cleaned while the blade 230 is rotated.

In step S500, the locking pin 300 is removed from the robot arm 220 after the cleaning of the front transfer chamber 130.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A processing system for performing a fabrication process on a wafer, the processing system comprising:
   a wafer storage cassette that receives at least one wafer;
   one or more process chambers;
   a transfer chamber having a body, a robot huh, a robot arm attached to the robot hub such that the arm can be extended into a position outward from the robot hub or contracted in a position toward the robot huh for moving a blade attached to the robot arm between an extended or contracted position, wherein the body of the transfer chamber is connected to the wafer storage cassette and the one or more process chambers, and the robot arm is configured to transfer the wafer on the blade from the wafer storage cassette through the body of the transfer chamber to one or more of the process chambers; and
   a locking pin that detachably attaches to the robot arm when the robot arm is in the contracted position and when attached with the robot arm constrains the robot arm from extending and thereby contra ins the blade from moving or extending in a radial direction from the robot hub toward the body of the transfer chamber and constrains the blade at a predetermined position of the blade within the transfer chamber to prevent the blade from colliding with the body of the transfer chamber.

2. The processing system of claim 1,
wherein the blade is formed of a ceramic material.

3. The processing system of claim 1,
wherein the locking pin is formed of Teflon.

4. The processing system of claim 1,
wherein the locking pin includes a handle and a plurality of fingers that extend from the handle, and the fingers engage the robot arm to constrain the robot arm at a predetermined position of the robot arm.

5. The processing system of claim 4,
wherein the plurality of fingers have four fingers separated from each other.

6. The processing system of claim 4,
wherein the locking pin comprises a first side and a second side, the plurality of fingers extend from the handle in a first direction that is parallel to a surface of the first side and a surface of the second side, a first sidewall of a finger on the first side of the locking pin comprises a first width in a second direction that is perpendicular to the first direction, the first width is greater than a second width of a second sidewall of the finger in the second direction, the second sidewall is opposite the first sidewall, a third sidewall of the finger extends between the first sidewall and the second sidewall, and the third sidewall extends a predetermined angle from the first sidewall.

7. The processing system of claim 6,
wherein the predetermined angle is about 27 degrees from the first sidewall.

8. The processing system of claim 4,
wherein at least two fingers of the plurality of fingers have different thickness from each other.

9. The processing system of claim 4,
wherein the locking pin further includes an area on a surface of the locking pin having a different color from a color of the handle.

* * * * *